(12) United States Patent
Balteanu et al.

(10) Patent No.: US 9,806,676 B2
(45) Date of Patent: Oct. 31, 2017

(54) POWER AMPLIFICATION SYSTEM WITH PROGRAMMABLE LOAD LINE

(71) Applicant: SKYWORKS SOLUTIONS, INC., Woburn, MA (US)

(72) Inventors: Florinel G. Balteanu, Irvine, CA (US); Paul T. DiCarlo, Marlborough, MA (US); Boshi Jin, Winchester, MA (US); Steven Christopher Sprinkle, Hampstead, NH (US); David Scott Whitefield, Andover, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/221,489

(22) Filed: Jul. 27, 2016

(65) Prior Publication Data

US 2017/0033747 A1 Feb. 2, 2017

Related U.S. Application Data

(60) Provisional application No. 62/198,044, filed on Jul. 28, 2015.

(51) Int. Cl.
*H03F 1/02* (2006.01)
*H03F 3/19* (2006.01)
(Continued)

(52) U.S. Cl.
CPC ......... *H03F 1/0277* (2013.01); *H03F 1/0266* (2013.01); *H03F 1/0272* (2013.01);
(Continued)

(58) Field of Classification Search
CPC . H03F 1/0277; H03F 1/56; H03F 3/19; H03F 3/345; H03F 200/102;
(Continued)

(56) References Cited

U.S. PATENT DOCUMENTS

| 7,417,508 B1* | 8/2008 | Quaglietta | H03F 1/56 330/124 R |
|---|---|---|---|
| 2002/0021169 A1 | 2/2002 | King et al. | |
| 2007/0111685 A1 | 5/2007 | Paul et al. | |
| 2012/0235737 A1* | 9/2012 | Reisner | H03F 1/0222 330/127 |

(Continued)

OTHER PUBLICATIONS

Written opinion of the International Searching Authority for PCT/US2016/044329 mailed Nov. 18, 2016, in 7 pages.

(Continued)

*Primary Examiner* — Edward Urban
*Assistant Examiner* — Ralph H Justus
(74) *Attorney, Agent, or Firm* — Chang & Hale LLP

(57) ABSTRACT

Disclosed herein are power amplification (PA) systems configured to amplify a signal, such as a radio-frequency signal. The PA system includes a plurality of power amplifiers that are configured to amplify a signal received at a signal input and to output the amplified signal at a signal output. The power amplifiers are configured to receive a supply voltage that is a combination of a battery voltage and an envelope tracking signal. The PA system includes a PA controller configured to control the power amplifiers based at least in part on the battery voltage or a power output of the power amplifiers. The PA controller can be configured to alter impedance matching components of the PA system to reconfigure a load line of the power amplifiers.

20 Claims, 11 Drawing Sheets

(51) Int. Cl.
*H03F 1/56* (2006.01)
*H03F 3/24* (2006.01)
*H03F 1/22* (2006.01)
*H03F 3/193* (2006.01)

(52) U.S. Cl.
CPC .............. *H03F 1/223* (2013.01); *H03F 1/56* (2013.01); *H03F 3/19* (2013.01); *H03F 3/193* (2013.01); *H03F 3/245* (2013.01); *H03F 2200/102* (2013.01); *H03F 2200/222* (2013.01); *H03F 2200/318* (2013.01); *H03F 2200/387* (2013.01); *H03F 2200/451* (2013.01)

(58) Field of Classification Search
CPC ......... H03F 2200/222; H03F 2200/318; H03F 2200/387; H03F 2200/451; H04W 88/02
USPC .................................. 455/571, 127.1, 127.2
See application file for complete search history.

(56) References Cited

U.S. PATENT DOCUMENTS

| | | | |
|---|---|---|---|
| 2012/0269240 A1* | 10/2012 | Balteanu | H03F 1/0227 375/219 |
| 2013/0093511 A1* | 4/2013 | Baek | H03F 3/602 330/124 R |
| 2014/0184335 A1* | 7/2014 | Nobbe | H03F 1/0227 330/291 |
| 2014/0266460 A1* | 9/2014 | Nobbe | H03F 1/0261 330/295 |
| 2015/0011256 A1 | 1/2015 | Tanaka et al. | |

OTHER PUBLICATIONS

International Search Report of the International Searching Authority for PCT/US2016/044329 mailed Nov. 18, 2016, in 3 pages.

* cited by examiner

POWER AMPLIFICATION SYSTEM WITH PROGRAMMABLE LOAD LINE

CROSS-REFERENCE TO RELATED APPLICATION(S)

This application claims priority to U.S. Provisional Application No. 62/198,044 filed Jul. 28, 2015, entitled POWER AMPLIFICATION SYSTEM WITH PROGRAMMABLE LOAD LINE, the disclosure of which is hereby expressly incorporated by reference herein in its entirety.

BACKGROUND

Field

The present disclosure relates to power amplification systems configured to amplify signals for wireless communication.

Description of Related Art

Power amplification systems can be used to amplify wireless signals for transmission. These amplification systems can be powered using a supply voltage. Impedance matching circuits can be used to match input and/or output impedances around the power amplifiers to increase or maximize power output.

SUMMARY

According to a number of implementations, the present disclosure relates to a power amplification system that includes a plurality of power amplifiers connected in parallel between a signal input terminal and a signal output terminal, each one of the plurality of power amplifiers including a power amplifier input terminal coupled to the signal input terminal, a power amplifier output terminal coupled to the signal output terminal, and an enable terminal for receiving an enable signal. The system also includes a power amplifier controller configured to selectively provide an enable signal to one or more of the plurality of power amplifiers based on an output impedance at the signal output terminal.

In some embodiments, the plurality of power amplifiers is powered by a supply voltage. In some embodiments, the supply voltage is unregulated by a DC-DC converter. In some embodiments, the supply voltage is combined with an envelope tracking signal to power the plurality of amplifiers. In some embodiments, the supply voltage and envelope tracking signal are combined by an LC combiner. In some embodiments, the power amplification system further includes a blocking inductor disposed between the LC combiner and the signal output terminal. In some embodiments, the envelope tracking signal is generated by a digital-to-analog conversion of a digital envelope signal. In some embodiments, the digital envelop signal includes two or more concurrent digital signals.

In some embodiments, the power amplifier controller is further configured to provide the enable signal based on the supply voltage. In some embodiments, the power amplifier controller is powered by the supply voltage.

In some embodiments, the power amplifier controller is further configured to provide the enable signal based on an output power at the signal output terminal. In some embodiments, the power amplifier controller is further configured to provide the enable signal based on a target output power.

In some embodiments, the plurality of power amplifiers includes one or more cascode amplifiers. In some embodiments, the power amplification system further includes an input impedance matching component disposed between the signal input terminal and the power amplifier input terminals. In some embodiments, the power amplification system further includes an output impedance matching component disposed between the power amplifier output terminals and the signal output terminal.

In a number of implementations, the present disclosure relates to a radio-frequency (RF) module that includes a packaging substrate configured to receive a plurality of components. The module also includes a power amplification system implemented on the packaging substrate, the power amplification system including a plurality of power amplifiers connected in parallel between an radio-frequency (RF) input terminal and an RF output terminal, each one of the plurality of power amplifiers including an power amplifier input terminal coupled to the RF input terminal, a power amplifier output terminal coupled to the RF output terminal, and an enable terminal for receiving an enable signal, the power amplification system further including a power amplifier controller configured to selectively provide an enable signal to one or more of the plurality of power amplifiers based on an output impedance at the RF output terminal.

In some embodiments, the module further includes an envelope tracker implemented on the packaging substrate, the envelope tracker configured to provide an envelope tracking signal based on a received digital envelope signal. In some embodiments, the module further includes an LC combiner implemented on the packaging substrate, the LC combiner configured to combine a supply voltage and the envelope tracking signal to power the plurality of power amplifiers.

In accordance with some implementations, the present disclosure relates to a wireless device that includes a transceiver configured to generate a radio-frequency (RF) signal. The device also includes a front-end module (FEM) in communication with the transceiver, the FEM including a packaging substrate configured to receive a plurality of components, the FEM further including a power amplification system implemented on the packaging substrate, the power amplification system including a plurality of power amplifiers connected in parallel between an radio-frequency (RF) input terminal and an RF output terminal, each one of the plurality of power amplifiers including an power amplifier input terminal coupled to the RF input terminal, a power amplifier output terminal coupled to the RF output terminal, and an enable terminal for receiving an enable signal, the power amplification system further including a power amplifier controller configured to selectively provide an enable signal to one or more of the plurality of power amplifiers based on an output impedance at the RF output terminal. The device also includes an antenna in communication with the FEM, the antenna configured to transmit the amplified RF signal received from the power amplification system.

In some embodiments, the device further includes a coupler configured to provide a copy of the signal at the RF output terminal to the power amplifier controller.

For purposes of summarizing the disclosure, certain aspects, advantages and novel features of the inventions have been described herein. It is to be understood that not necessarily all such advantages may be achieved in accordance with any particular embodiment. Thus, the inventions may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Power amplification systems are often powered using a supply voltage (e.g., from a battery). In some implementations, the voltage from the battery is regulated (e.g., with a buck converter or a boost converter) to a fixed value to compensate for variations in the voltage output from the battery due to manufacturing variation, age, temperature, or other effects. Failure to employ such a regulator can result in a change in the compression characteristics of the power amplifier and degrade its linearity. However, use of a regulator increases the overall cost of the system.

Disclosed herein are various examples of circuits, devices and methods that can be configured to, among other things, address the foregoing challenges associated with power amplification systems. In some implementations as described herein, a power amplification system is powered by a supply voltage that is combined with an envelope tracking signal to provide a dynamic boost. In some implementations, the power amplification system is configured with a programmable load line based on the supply voltage, output power level, and/or output impedance.

Figure 1:
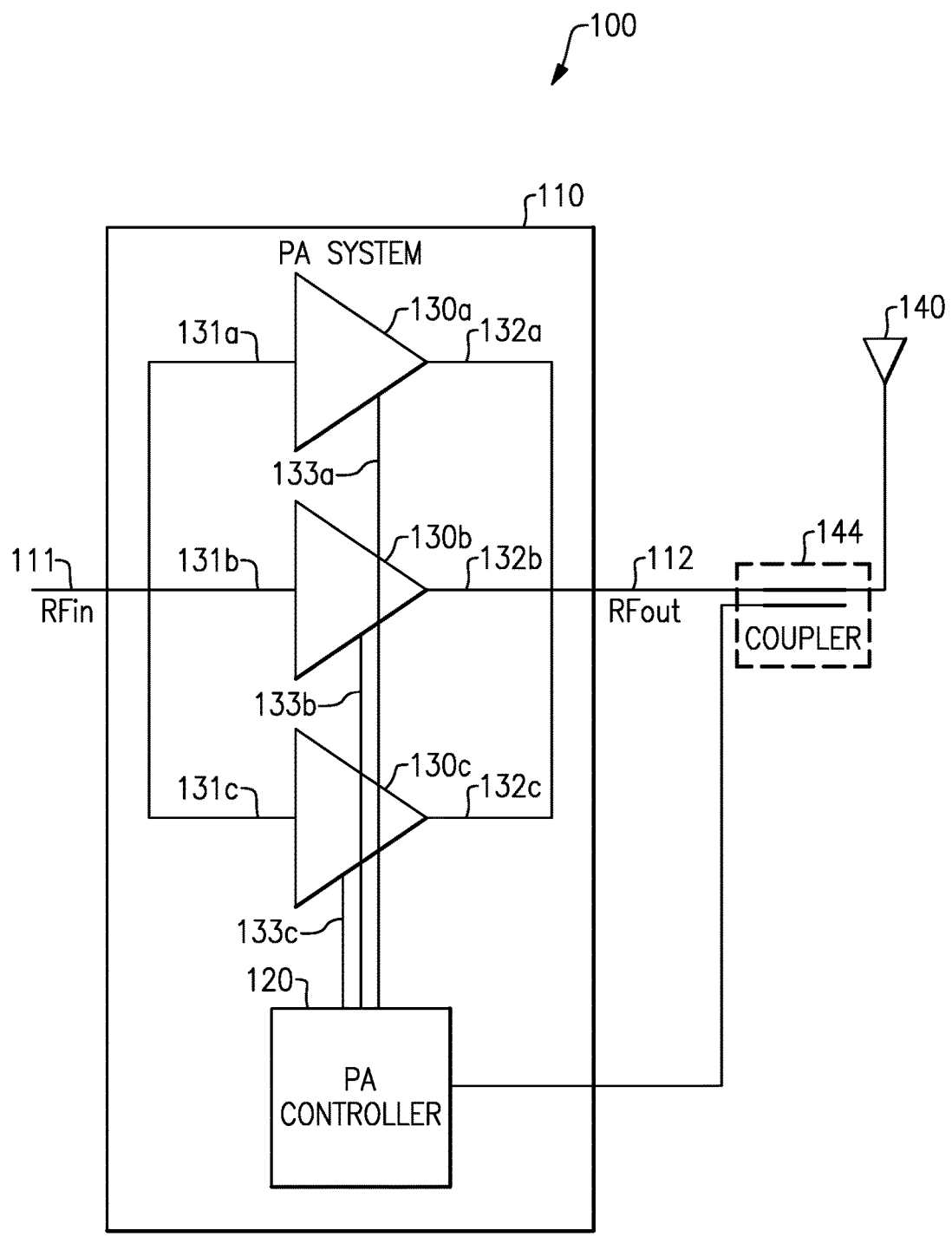
FIG. 1 illustrates an example wireless communication configuration that includes a power amplification system with a plurality of power amplifiers that are configured to be selectively enabled by a power amplification controller.

FIG. 1 schematically shows an example wireless communication configuration 100 that includes a power amplification (PA) system 110 coupled to an antenna 140. The PA system 110 includes a power amplification (PA) controller 120 and a plurality of power amplifiers 130a-130c connected in parallel between a signal input terminal 111 and a signal output terminal 112. In operation, the PA system 110 receives a signal (e.g., a radio frequency signal) at the signal input terminal 111 and outputs an amplified version of the signal at the signal output terminal 112. In certain implementations, the plurality of power amplifiers 130a-130c can be connected in series or arranged in a multi-stage amplification configuration. Similarly, a different number of power amplifiers can be used, such as two, four, five, six, seven, etc.

Each one of the plurality of power amplifiers 130a-130c includes a power amplifier input terminal 131a-131c coupled to the signal input terminal 111, a power amplifier output terminal 132a-132c coupled to the signal output terminal 112, and an enable terminal 133a-133c for receiving an enable signal. When enabled, each of the power amplifiers 130a-130c produce, at the power amplifier output terminal 132a-132c, an amplified version of the signal received at the power amplifier input terminal 131a-131c. In various implementations, the enable signal can be a biasing voltage that biases one or more transistors of the power amplifier 130a-130c, a switching signal that closes one or more switches between the signal input terminal 111 and the power amplifier input terminals 131a-131b or between the signal output terminal 112 and the power amplifier output terminals 132a-132, or any other kind of enable (or disable) signal.

In some implementations, each of the power amplifiers 130a-130c are identical (e.g., produce the same current). In some implementations, the power amplifiers 130a-130c are different (e.g., produce different amounts of current). For example, each power amplifier 130a-130c may output twice the current of another of the power amplifiers 130a-130c to provide a variety of current outputs in a binary fashion.

The wireless communication configuration 100 further includes a coupler 144 disposed between the signal output terminal 112 and the antenna 140. The coupler 144 provides a copy of the amplified signal to the PA controller 120. Based on this received copy of the output signal, the PA controller 120 can determine an output impedance at the signal output terminal 112. In some implementations, the PA controller 120 can additionally (or alternatively) determine an output power at the signal output terminal 112 or a VSWR (Voltage Standing Wave Ratio) of the PA system 110. The output impedance can change based on environmental factors, such as humidity or temperature of the air around the antenna 140, objects proximal to the antenna 140, age of the antenna 140, or other factors.

Based on the output impedance (and/or output power), the PA controller 120 determines which of the plurality of power amplifiers 130a-130c to enable (or not enable). Thus, the PA controller 120 selectively provides an enable signal to one or more of the plurality of power amplifiers 130a-130c (via the enable terminals 133a-133b) based on an output impedance (and/or output power) at the signal output terminal 112.

Figure 2:
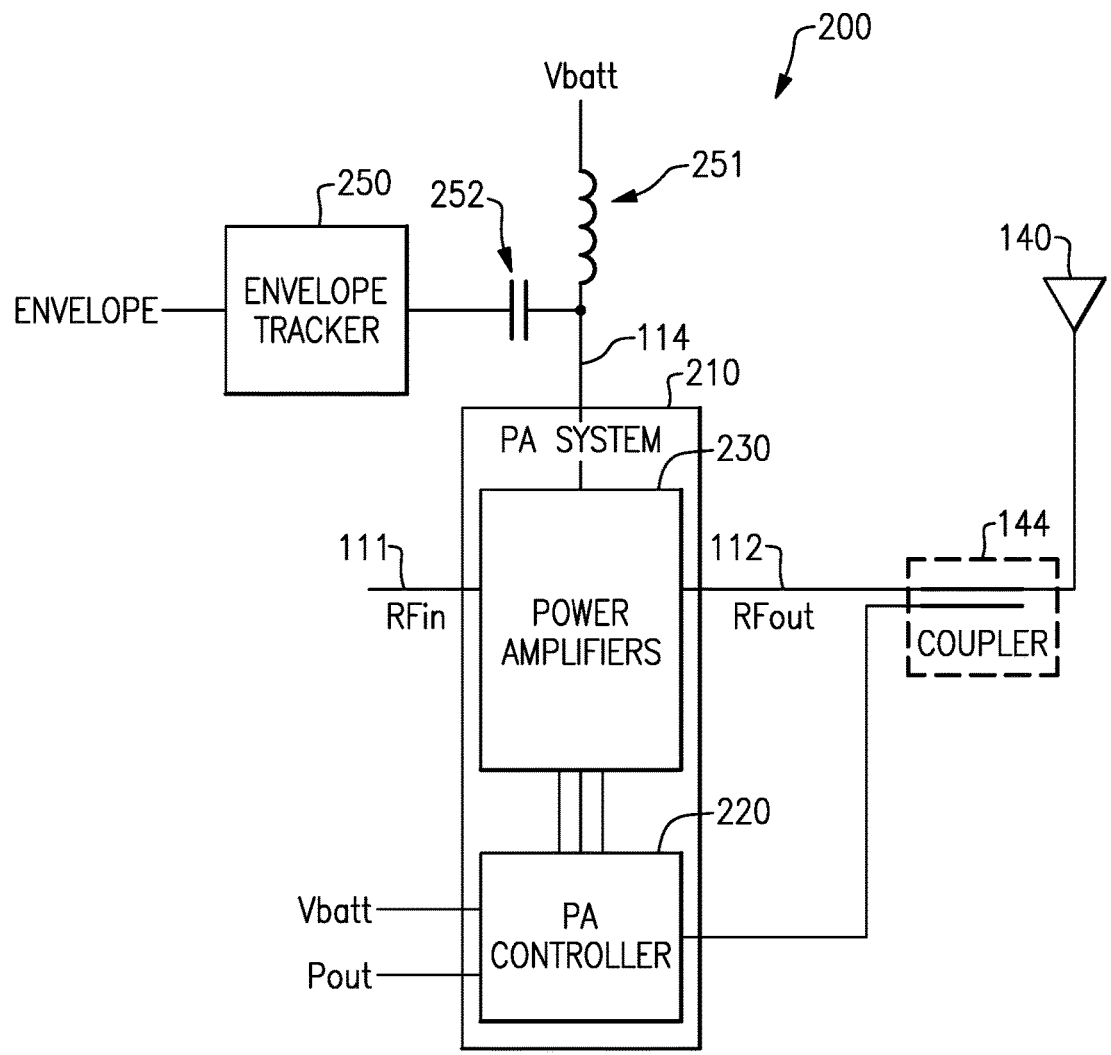
FIG. 2 illustrates an example wireless communication configuration that includes a power amplification system and an envelope tracker, the power amplification system dynamically controlled by the power amplification controller to increase performance.

FIG. 2 shows that, in some embodiments, a wireless communication configuration 200 can include a PA system 210 powered by a supply voltage. The wireless communication configuration 200 includes a PA system 210 including a plurality of power amplifiers 230 connected between a signal input terminal 111 and a signal output terminal 112. The power amplifiers 230 can include a plurality of amplifiers arranged in parallel, arranged in series, arranged to have multiple amplification stages, or any combination of these.

The power amplifiers 230 are powered by a supply voltage (Vbatt) via a supply terminal 114. In some implementations (e.g., as shown in FIG. 2), the supply voltage is unregulated by a DC-DC converter, such as a buck converter or a boost converter. However, the supply voltage is combined with an envelope tracking signal to power the power amplifiers 230. An envelope tracker 250 receives a signal indicative of the envelope of the signal to be amplified and produces the envelope tracking signal. The supply voltage and the envelope tracking signal are combined with an LC combiner including an inductor 251 coupled between the supply voltage and the supply terminal 114 and a capacitor 252 coupled between the envelope tracker 250 and the supply terminal 114.

The PA system 210 further includes a PA controller 220 configured to selectively provide an enable signal to one or more of the plurality of power amplifiers 230 based on an output impedance at the signal output terminal 112. As described above, the output impedance can be determined based on a signal received from a coupler 144 disposed between the signal output terminal 112 and an antenna 140.

In some implementations, the PA controller 220 is further configured to provide the enable signal based on the supply voltage. In some implementations, the PA controller 220 is powered by the supply voltage and can, thereby, determine the supply voltage and any variations thereof. In some implementations, the PA controller 220 is powered by a different voltage and receives a signal indicative of the supply voltage. In various implementations, the signal can be the supply voltage, an attenuated version of the supply voltage, a digital signal indicative of whether the supply voltage is above or below a threshold, or an analog voltage indicative of an amount that the supply voltage exceeds a threshold.

In some implementations, the PA controller 220 is further configured to provide the enable signal based on an output power at the signal output terminal 112. As described above, the output power can be determined based on a signal received from a coupler 144 disposed between the signal output terminal 112 and an antenna 140. In some implementations, the PA controller 220 is further configured to provide the enable signal based on a target output power (Pout) received from a baseband controller or other component.

In some implementations, in response to a higher output impedance, the PA controller 220 enables more of the power amplifiers 230 (or enables a different set of power amplifiers 230 that outputs more current). Similarly, in response to a lower output impedance, the PA controller 220 enables fewer of the power amplifiers 230 (or enables a different set of power amplifiers 230 that outputs less current). In some implementations, if the output power is lower than the target output power, the PA controller 220 enables more of the power amplifiers 230 (or enables a different set of power amplifiers 230 that outputs more current). Similarly, if the output power is higher than the target output power, the PA controller 220 enables fewer of the power amplifiers 230 (or enables a different set of power amplifiers 230 that outputs less current).

In some implementations, in response to a lower supply voltage, the PA controller 220 enables more of the power amplifiers 230 (or enables a different set of power amplifiers 230 that outputs more current). Similarly, in response to a higher supply voltage, the PA controller 220 enables fewer of the power amplifiers 230 (or enables a different set of power amplifiers 230 that outputs less current).

In a number of embodiments, the present disclosure provides a power amplification (PA) system 210 configured to amplify a signal, such as a radio-frequency signal. The PA system 210 includes a signal input 111 and a signal output 112 with a plurality of power amplifiers 230 coupled between the signal input 111 and the signal output 112. The power amplifiers 230 are configured to amplify a signal received at the signal input 111 and to output the amplified signal at the signal output 112. The power amplifiers 230 are configured to receive a supply voltage that is a combination of a battery voltage and an envelope tracking signal. The PA system 210 includes a PA controller 220 configured to control the power amplifiers 230 based at least in part on the battery voltage or a power output of the power amplifiers 230. The PA controller 220 is configured to receive a signal indicative of the output signal at the signal output 112 from a coupler 144. The PA controller is further configured to alter impedance matching components of the PA system 210 to reconfigure a load line of the power amplifiers 230.

Figure 3:
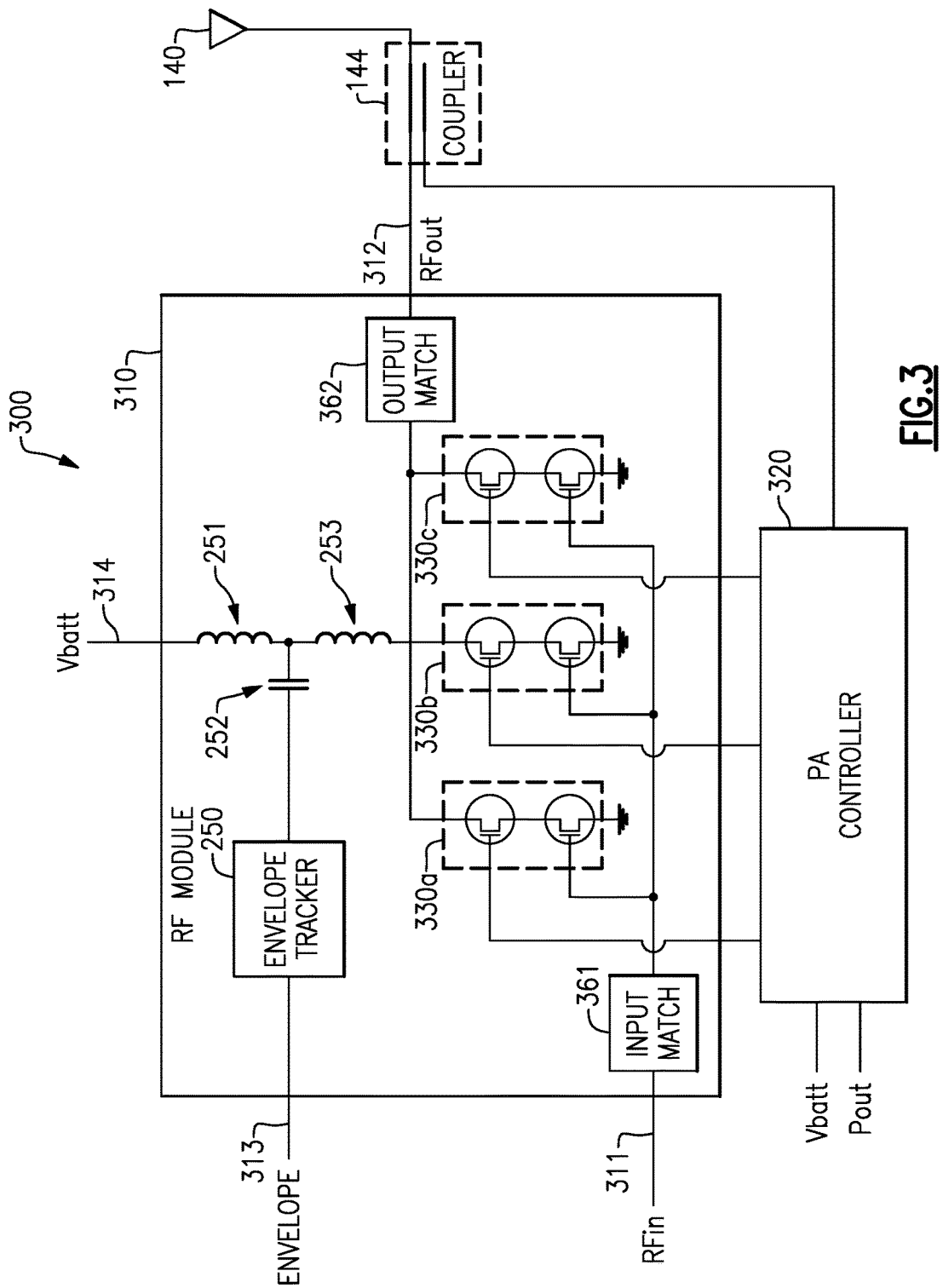
FIG. 3 illustrates a wireless communication configuration that includes a plurality of cascode power amplifiers that can be controlled by a power amplification controller based on output power and/or supply voltage.

FIG. 3 shows that, in some embodiments, a wireless communication configuration 300 can include a plurality of cascode power amplifiers 330a-330c. The wireless communication configuration 300 includes an RF module 310 including a plurality of power amplifiers 330a-330b connected in parallel between a signal input terminal 311 of the RF module 310 and a signal output terminal 312 of the RF module 310.

Each of the power amplifiers 330a-330b is a cascode power amplifier including two transistors, a drain of the first transistor coupled to a source of a second transistor. Each of the power amplifiers 330a-330b are powered by a supply voltage (Vbatt) via a supply terminal 314 of the RF module 310. In some implementations (e.g., as shown in FIG. 3), the supply voltage is unregulated by a DC-DC converter, such as a buck converter or a boost converter. However, the supply voltage is combined with an envelope tracking signal to power the power amplifiers 330a-330c. An envelope tracker 250 (e.g., as described below with respect to FIG. 4) receives, at one or more envelope terminals 313 of the RF module 310, a signal indicative of the envelope of the signal to be amplified and produces the envelope tracking signal.

The supply voltage and the envelope tracking signal are combined with an LC combiner including an inductor 251 coupled between the supply voltage and an LC node and a capacitor 252 coupled between the envelope tracking signal and the LC node. A matching inductor 253 is disposed between the LC node and the power amplifiers 330a-330c. In particular, the matching inductor 253 is disposed between the LC combiner and the signal output terminal 312. The LC combiner operates to combine the constant component of the supply voltage and the variable component of the envelope tracking signal. The matching inductor 253 operates to block the amplified signal (at the output terminal 312) from propagating to the envelope tracker 250 or other components of the RF module 310.

The supply voltage combined with the envelope tracking signal is used to power the power amplifiers 330a-330c by feeding it (via the matching inductor 253) to a source of the first transistor of each of the cascode power amplifiers.

Each of the power amplifiers 330a-330c receives the signal to be amplified from the signal input terminal 311 of the RF module 310 (via an input impedance matching component 361) and provides an amplified version of the signal at the signal output terminal 312 of the RF module 310 (via an output impedance matching component 362). Thus, the input impedance matching component 361 is disposed between the signal input terminal 311 and the power amplifier input terminals and the output impedance matching component 362 is disposed between the power amplifier output terminals and the signal output terminal 312.

The signal to be amplified is fed to a gate of the second transistor of each of the cascode power amplifiers. Although not shown in FIG. 3, a biasing voltage may also be provided to the gate of the second transistor of each of the cascode power amplifiers. The amplified signal is output from the source of the first transistor of each of the cascode power amplifiers that are enabled (e.g., by the PA controller 320).

The cascode power amplifiers are enabled by providing a biasing voltage to the gate of the first transistor of the cascode power amplifier.

The wireless communication configuration 300 further includes a PA controller 320 configured to selectively provide an enable signal to one or more of the plurality of power amplifiers 330a-330c based on an output impedance at the signal output terminal 312. As described above, the output impedance can be determined based on a signal received from a coupler 144 disposed between the signal output terminal 312 and an antenna 140.

In some implementations, the PA controller 320 is further configured to provide the enable signal based on the supply voltage. In some implementations, the PA controller 320 is powered by the supply voltage and can, thereby, determine the supply voltage and any variations thereof. In some implementations, the PA controller 320 is powered by a different voltage and receives a signal indicative of the supply voltage.

In some implementations, the PA controller 320 is further configured to provide the enable signal based on an output power at the signal output terminal 312. As described above, the output power can be determined based on a signal received from a coupler 144 disposed between the signal output terminal 312 and an antenna 140. In some implementations, the PA controller 220 is further configured to provide the enable signal based on a target output power (Pout) received from a baseband controller or other component.

Although FIG. 3 illustrates a plurality of power amplifiers 330a-330c as a plurality of cascode amplifiers, in various implementations, the power amplifiers can include different types of power amplifiers, such as one or more single-transistor amplifiers, one or more multi-stage amplifiers (e.g., including a driver stage and an output stage), one or more Doherty amplifiers, or other types of power amplifiers. Similarly, where the plurality of power amplifiers 330a-330c are arranged as a multi-staged amplifier, interstage impedance matching can be implemented between stages, similar in function to the input match circuit 361 and the output match circuit 362.

Figure 4:
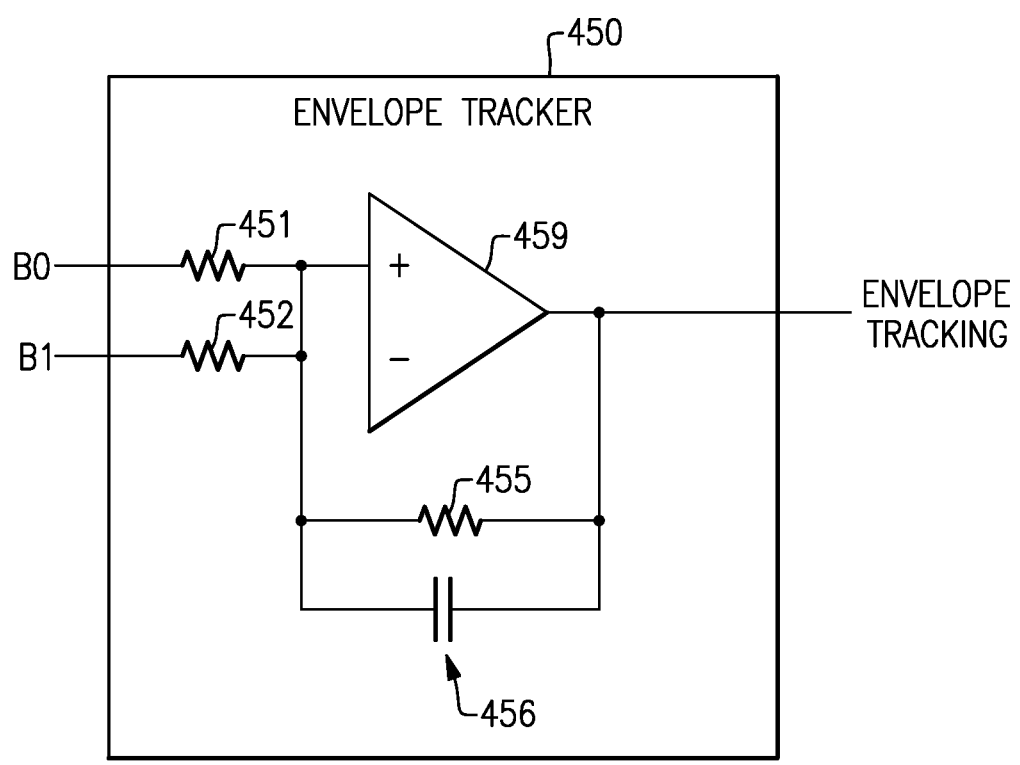
FIG. 4 illustrates an example envelope tracker that is configured to receive an envelope signal as a two-bit digital signal.

FIG. 4 shows that, in some embodiments, an envelope tracker 450 can receive an envelope signal as a two-bit digital signal. The envelope tracker 450 receives a first one-bit digital signal via a first resistor 452 and a second one-bit digital signal via a second resistor 452. The second resistor 452 may be twice the resistance of the first resistor 451. In some implementations, the envelope signal is a one-bit signal received via a single terminal or a three-or-more-bit signal received via three or more terminals. Thus, the digital envelope signal received by the envelope tracker can include two or more concurrent digital signals.

The digital envelope signals are fed to a comparator 459 to effect a digital-to-analog conversion. The output of the comparator 459 is fed back to the input via a low-pass RC filter including a RC resistor 455 and an RC capacitor 456 connected in parallel. The output of the comparator 459 provides an envelope tracking signal that may be combined with a supply voltage (e.g., via an LC combiner) to power a plurality of power amplifiers as described above. Thus, the envelope tracking signal is generated by a digital-to-analog conversion of a digital envelope signal.

Figure 5:
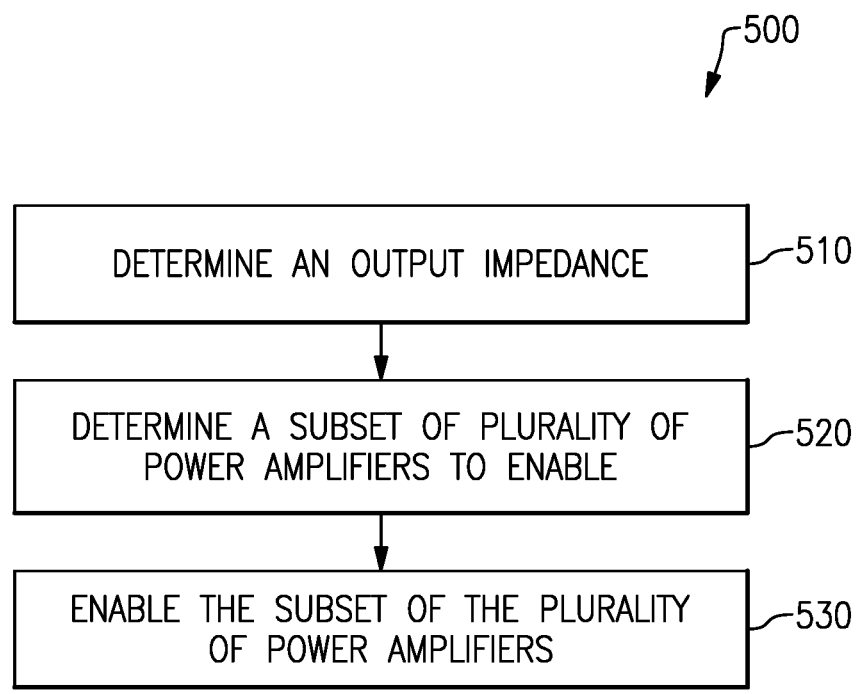
FIG. 5 illustrates a flowchart representation of an example method of processing an RF signal based at least in part on an output impedance.

FIG. 5 shows a flowchart representation of a method 500 of processing an RF signal. In some implementations (and as detailed below as an example), the method 500 is at least partially performed by a PA controller, such as the PA controller 320 of FIG. 3. In some implementations, the method 500 is at least partially performed by processing logic, including hardware, firmware, software, or a combination thereof. In some implementations, the method 500 is at least partially performed by a processor executing code stored in a non-transitory computer-readable medium (e.g., a memory).

The method 500 begins, at block 510, with the PA controller determining an output impedance. In some implementations, the PA controller determines the output impedance based on a copy of an RF output signal received via a coupler. In some implementations, the PA controller further determines an output power and/or a VSWR.

At block 520, the PA controller determines a subset of a plurality of power amplifiers to enable based on the output impedance. The subset of the plurality of power amplifiers can include one, two, or all of the plurality of power amplifiers. In some implementations, in response to a higher output impedance, the PA controller enables more of the power amplifiers (or enables a different subset of the power amplifiers to output more current). Similarly, in response to a lower output impedance, the PA controller enables fewer of the power amplifiers (or enables a different subset of the power amplifiers to output less current).

At block 530, the PA controller enables the subset of the plurality of power amplifiers. In some implementations, the PA controller enables each of the subset of the plurality of amplifiers by providing a biasing voltage to a bias terminal of each of the subset.

Figure 6:
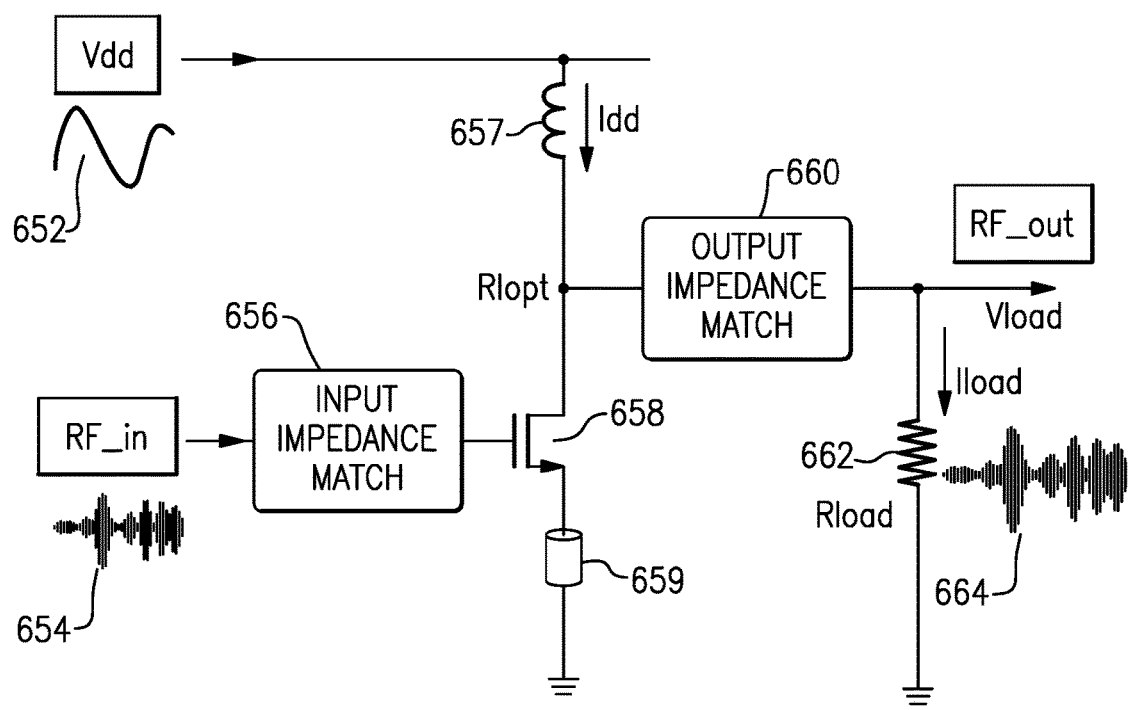
FIG. 6 illustrates a schematic illustration of a power amplification system that includes input and output impedance matching to dynamically configure a load line.

FIG. 6 illustrates a schematic illustration of a power amplification (PA) system that includes input and output impedance matching to dynamically configure a load line. The PA system can be similar to the PA systems described herein with reference to FIGS. 1-3. The PA system is configured to receive an input signal 654 (e.g., a RF signal) and provide that signal to an active device such as an amplifier 658 (e.g., one or more transistors). The input of the PA system is coupled to the amplifier 658 through an input impedance match circuit 656. The amplifier 658 can be coupled to ground or a ground potential through a component 659, the component 659 configured to provide close to zero impedance to ground to increase efficiency of the amplification process.

The PA system includes a supply voltage, Vdd, that can vary with time, such as supply signal 652. As described in greater detail herein, the supply signal 652 can be a combination of a voltage from a battery and an envelope tracking signal. Accordingly, the supply signal 652 can vary in time resulting in a varying current, Idd, through a matching inductor 657 to the amplifier 658. The changing supply voltage, Vdd, and/or supply current, Idd, can result in a change in characteristics of the load line of the amplifier 658.

The PA system includes an output impedance match circuit 660 configured to provide a matching or targeted impedance at the output of the amplifier 658 and/or to provide a targeted impedance for the load 662 (e.g., Rload). In some implementations, the output impedance match circuit 660 is controlled to provide a targeted impedance to provide a targeted resistance at the output of the amplifier, Rlopt. This can be done to achieve a greater power output from the amplifier. The PA system outputs an amplified signal 664 (e.g., RF_out) with a voltage across the load 662, Vload, and a current across the load 662, Iload.

Figure 8A:
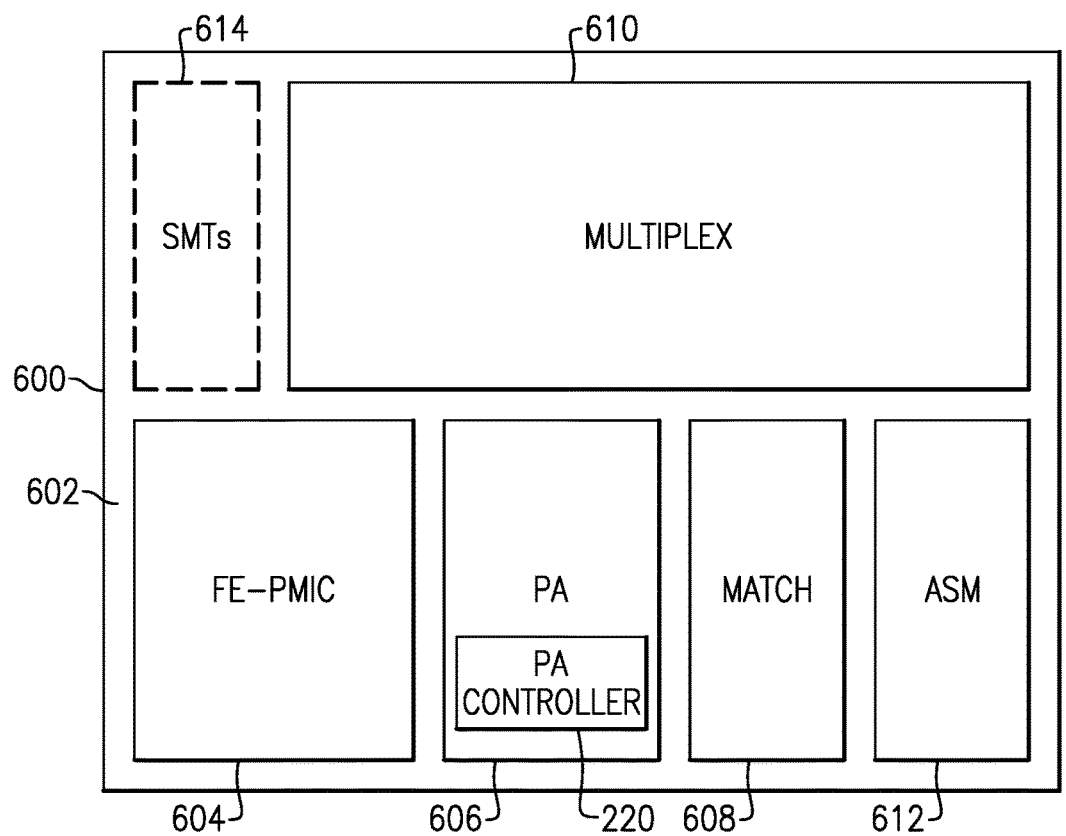
FIGS. 8A and 8B illustrate power amplification systems having one or more features as described herein can be implemented, wholly or partially, in a module.
Figure 8B:
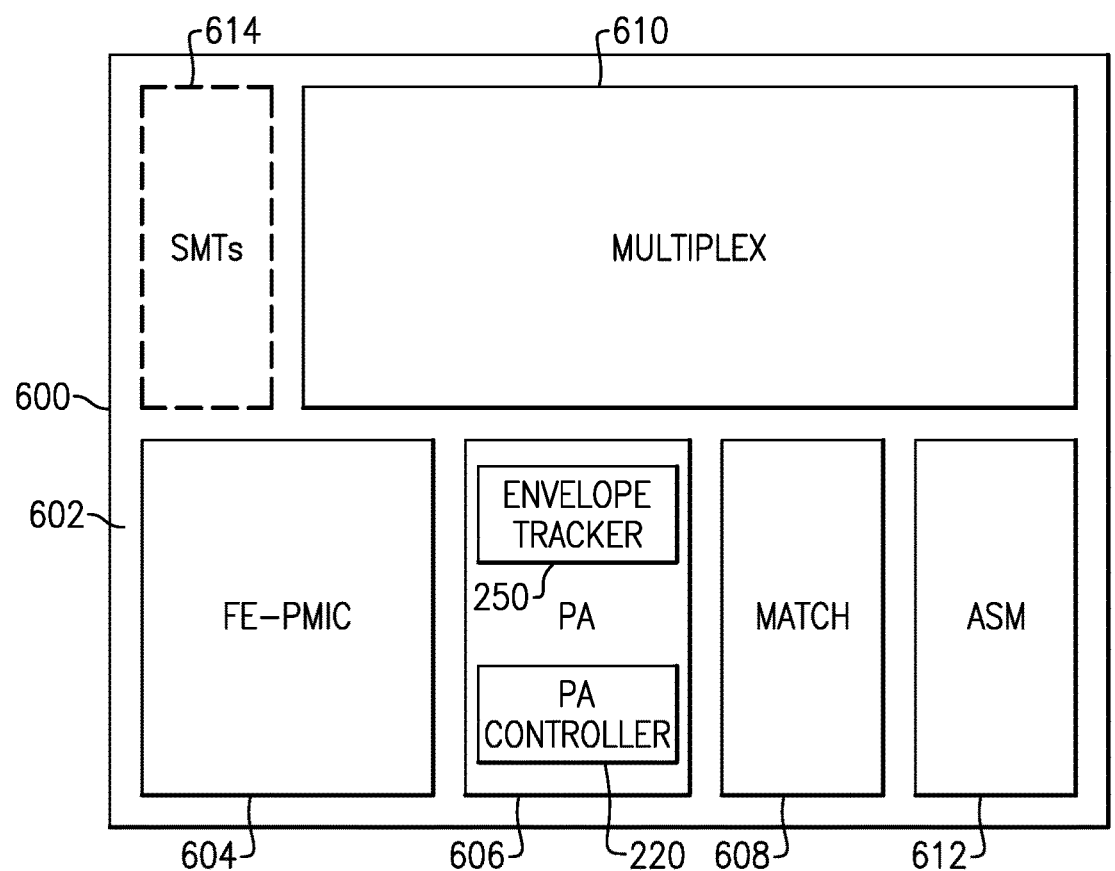
Figure 9A:
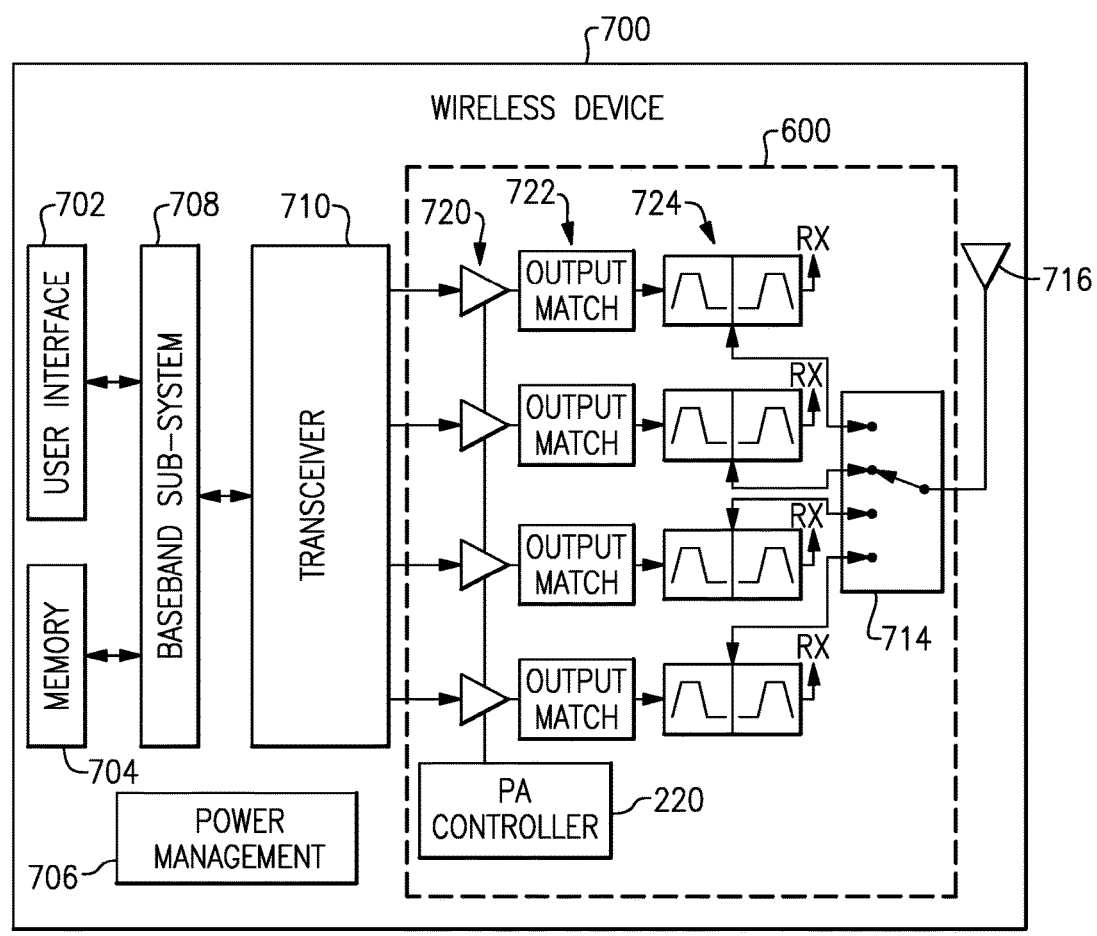
FIGS. 9A and 9B illustrate example wireless devices having one or more advantageous features described herein.
Figure 9B:
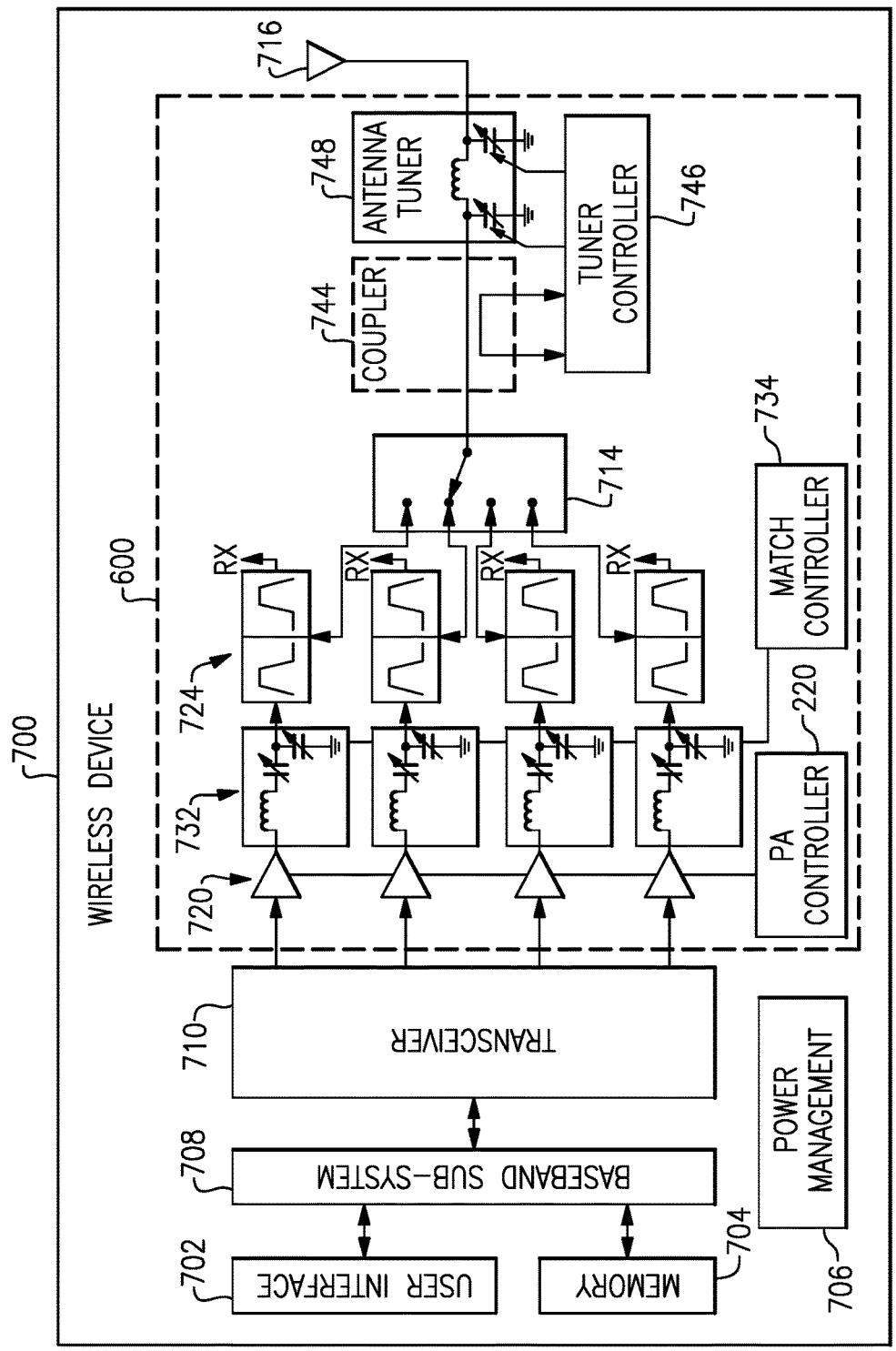

In some embodiments, the PA system includes a controller, such as the controllers described herein with reference to FIGS. 2-4 and 8A-9B. The controller is configured to modify the output impedance to provide a programmable load line for the amplifier. For example, the PA system can be configured to reconfigure the load line to the amplifier 658 based on the supply voltage (e.g., the voltage provided by a battery or other power source) and/or VSWR (voltage standing wave ratio) to increase or maximize the efficiency of the amplifier 658. In some embodiments, the PA system modifies the output impedance match circuit 660 to result in a targeted load line for the amplifier 658. In some embodiments, the PA system modifies the current to the amplifier to achieve a targeted load line for the amplifier 658. In certain implementations, a PA system that uses a battery rather than a DC-to-DC converter may perform more efficiently or otherwise improve performance through the use of a programmable or reconfigurable load line, as described herein. For example, FIG. 9B illustrates an example implementation of a wireless device that includes one or more components configured to reconfigure the load line(s) to an amplifier(s).

Figure 7:
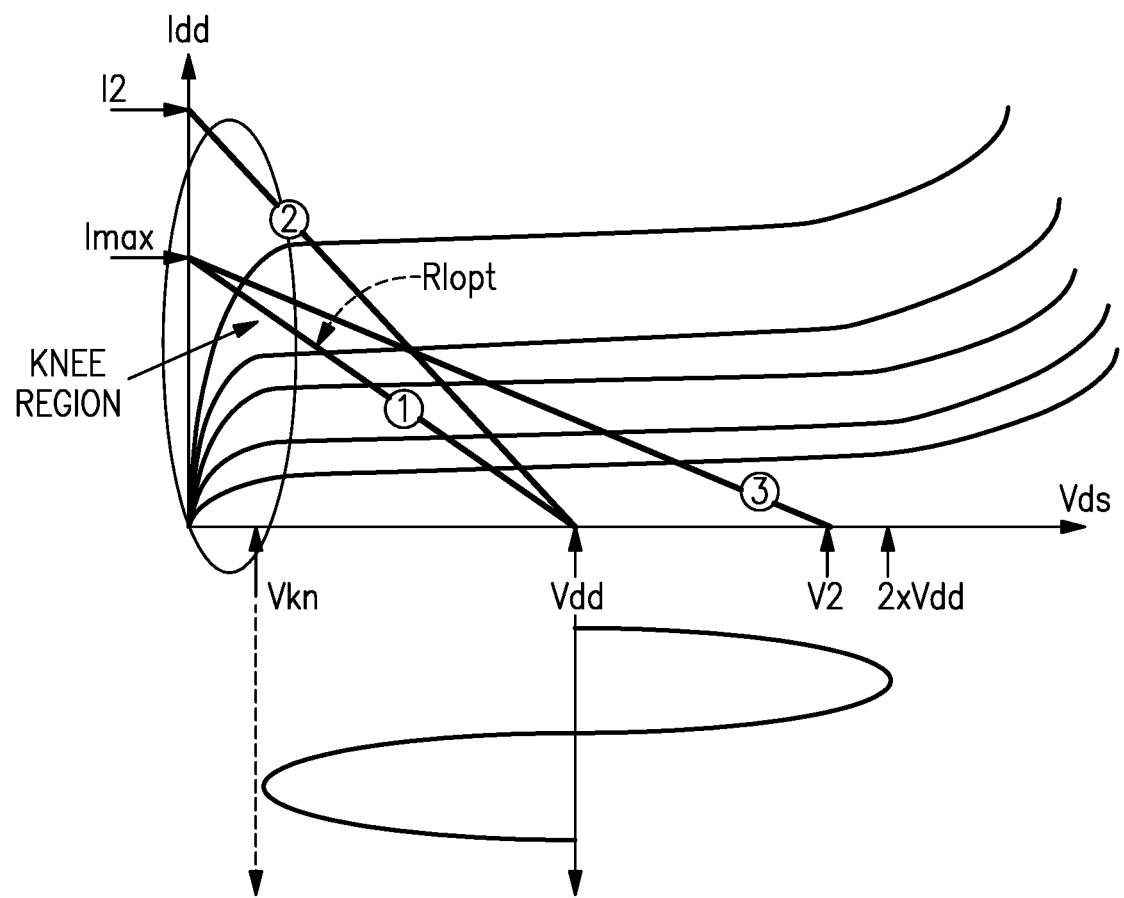
FIG. 7 illustrates a plot of example load lines that can be programmed based on the supply voltage, output power, and/or output impedance.

FIG. 7 illustrates a plot of example load lines that can be programmed based on the supply voltage, output power, and/or output impedance. As described with reference to FIG. 6, supply voltage to the amplifier can vary with time. Modification of the current to the amplifier can be performed to achieve targeted or desired performance characteristics. Each of the load lines 1-3 included in FIG. 7 represent different slopes for the load line that are based on different voltages and different currents, the slope being related to the resistance at the output of the amplifier (e.g., Rlopt). Due at least in part to the voltage and/or current to the amplifier being configured to change, a PA system can be configured to change the load line to achieve improvements in performance (e.g., greater efficiency) relative to a PA system with a load line that is not programmable or reconfigurable.

The plot in FIG. 7 also illustrates a knee voltage, Vkn, in the knee region that can be used when determining a targeted output power. For example, a maximum output power, P_out-max, can be calculated using the below formula, where Vkn is the knee voltage, Vdd is the supply voltage, and Rlopt is the resistance at the output of the amplifier:

$$P_{out\text{-}max} = (V_{dd} - V_{kn})^2 / 2R_{lopt}$$

FIGS. 8A and 8B show that in some embodiments, some or all of power amplification configurations (e.g., those shown in FIGS. 1-3) can be implemented, wholly or partially, in a module. Such a module can be, for example, a front-end module (FEM). In the example of FIGS. 8A and 8B, a module 600 can include a packaging substrate 602, and a number of components can be mounted on such a packaging substrate 602. For example, an FE-PMIC component 604, a power amplifier assembly 606 (which includes a PA controller 220, examples of which are described herein with reference to FIGS. 1-3, 9A, and 9B), a match component 608, and a multiplexer assembly 610 can be mounted and/or implemented on and/or within the packaging substrate 602. Other components such as a number of SMT devices 614 and an antenna switch module (ASM) 612 can also be mounted on the packaging substrate 602. Although all of the various components are depicted as being laid out on the packaging substrate 602, it will be understood that some component(s) can be implemented over other component(s).

In some embodiments, as illustrated in FIG. 8B, the power amplifier assembly 606 includes an envelope tracker 250, examples of which are described herein with reference to FIGS. 2-4.

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

FIGS. 9A and 9B depict example wireless devices 700 having one or more advantageous features described herein. In the context of a module having one or more features as described herein, such a module can be generally depicted by a dashed box 600, and can be implemented as, for example, a front-end module (FEM).

Referring to FIG. 9A, power amplifiers (PAs) 720 can receive their respective RF signals from a transceiver 710 that can be configured and operated in known manners to generate RF signals to be amplified and transmitted, and to process received signals. The transceiver 710 is shown to interact with a baseband sub-system 708 that is configured to provide conversion between data and/or voice signals suitable for a user and RF signals suitable for the transceiver 710. The transceiver 710 can also be in communication with a power management component 706 that is configured to manage power for the operation of the wireless device 700. Such power management can also control operations of the baseband sub-system 708 and the module 600.

The baseband sub-system 708 is shown to be connected to a user interface 702 to facilitate various input and output of voice and/or data provided to and received from the user. The baseband sub-system 708 can also be connected to a memory 704 that is configured to store data and/or instructions to facilitate the operation of the wireless device, and/or to provide storage of information for the user.

In the example wireless device 700, outputs of the PAs 720 are shown to be matched (via respective output match circuits 722) and routed to their respective diplexers 724. Such amplified and filtered signals can be routed to an antenna 716 (or multiple antennas) through an antenna switch 714 for transmission. In some embodiments, the diplexers 724 can allow transmit and receive operations to be performed simultaneously using a common antenna (e.g., 716). In FIGS. 9A and 9B, received signals are shown to be routed to "Rx" paths (not shown) that can include, for example, a low-noise amplifier (LNA).

The wireless device 700 includes a power amplification (PA) controller 220 configured to selectively control the PAs 720 to increase performance. The PA controller 220 can be configured, for example, to modify the load line based at least in part on the supply voltage, power output, and/or output impedance (e.g., the impedance of the output match circuits 722). Further detail and examples of PA controllers are described herein with reference to FIGS. 1-3 and 8A-8B.

FIG. 9B illustrates an example implementation of a wireless device 700 that includes a power amplification controller 220, a match controller 734, and a tuner controller 746. In some embodiments, one or more of the power amplification controller 220, the match controller 734, and the tuner controller 746 can be implemented in a single controller (e.g., the PA controller 220). As described elsewhere herein, the PA controller 220, the match controller 734, and/or the tuner controller 746 can receive signals from the coupler 744, from a power or voltage supply, and/or other signals indicative of an output impedance and/or output power.

The PA controller 220 is configured to selectively enable and/or disable individual power amplifiers 720. The match controller 734 is configured to control the impedance of the output matching circuits 732. As illustrated, each output matching circuit 732 includes an inductive component and two variable capacitance components. The match controller

734, in some embodiments, controls the capacitance of individual output matching circuits 732 to provide a targeted output resistance (e.g., Rlopt described herein with reference to FIGS. 6 and 7). However, the output matching circuits 732 can be configured differently from the illustrated configuration. Similarly, individual output matching circuits 732 can differ from one another and need not be identical to one another.

The tuner controller 746 is configured to control an antenna tuner 748 that is coupled to the antenna 716. As illustrated, the antenna tuner 748 is configured with two variable capacitance components and an inductive component. The tuner controller 746, in certain embodiments, is configured to control the capacitances of the variable capacitance components to tune the output to the antenna 716. The tuner controller 744 can receive a signal from the coupler 744 that is correlated with the signal output from the ASM 714. The tuner controller 744 can be configured to configure the antenna tuner 748 based at least in part on the signal provided by the coupler 744.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
a plurality of power amplifiers connected in parallel between a signal input terminal and a signal output terminal, each one of the plurality of power amplifiers including a power amplifier input terminal coupled to the signal input terminal, a power amplifier output terminal coupled to the signal output terminal, and an enable terminal for receiving an enable signal, the plurality of power amplifiers powered by a supply voltage;
an output impedance matching component disposed between the plurality of power amplifier output terminals and the signal output terminal; and
a power amplifier controller configured to selectively provide an enable signal to one or more of the plurality of power amplifiers based on an output impedance at the signal output terminal and, based on a value of the supply voltage, to adjust the output impedance matching component to provide a targeted resistance at the plurality of power amplifier output terminals to provide a targeted load line for the plurality of power amplifiers to improve efficiency of the plurality of power amplifiers.

2. The power amplification system of claim 1 wherein the supply voltage is unregulated by a DC-DC converter.

3. The power amplification system of claim 1 wherein the supply voltage is combined with an envelope tracking signal to power the plurality of amplifiers.

4. The power amplification system of claim 3 wherein the supply voltage and envelope tracking signal are combined by an LC combiner.

5. The power amplification system of claim 4 further comprising a blocking inductor disposed between the LC combiner and the signal output terminal.

6. The power amplification system of claim 3 wherein the envelope tracking signal is generated by a digital-to-analog conversion of a digital envelope signal.

7. The power amplification system of claim 6 wherein the digital envelop signal includes two or more concurrent digital signals.

8. The power amplification system of claim 1 wherein the power amplifier controller is further configured to provide the enable signal based on the supply voltage.

9. The power amplification system of claim 1 wherein the power amplifier controller is powered by the supply voltage.

10. The power amplification system of claim 1 wherein the power amplifier controller is further configured to provide the enable signal based on an output power at the signal output terminal.

11. The power amplification system of claim 10 wherein the power amplifier controller is further configured to provide the enable signal based on a target output power.

12. The power amplification system of claim 1 wherein the plurality of power amplifiers includes one or more cascode amplifiers.

13. The power amplification system of claim 1 further comprising an input impedance matching component disposed between the signal input terminal and the power amplifier input terminals.

14. The power amplification system of claim 1 wherein the power amplifier controller is further configured to adjust a current to one or more of the plurality of power amplifiers to provide the targeted load line.

15. A radio-frequency (RF) module comprising:
a packaging substrate configured to receive a plurality of components; and
a power amplification system implemented on the packaging substrate, the power amplification system including a plurality of power amplifiers connected in parallel between a radio-frequency (RF) input terminal and an RF output terminal, each one of the plurality of power amplifiers including a power amplifier input terminal coupled to the RF input terminal, a power amplifier output terminal coupled to the RF output terminal, and an enable terminal for receiving an enable signal, the plurality of power amplifiers powered by a supply voltage, the power amplification system further including an output impedance matching component disposed between the plurality of power amplifier output terminals and the signal output terminal, the power amplification system further including a power amplifier controller configured to selectively provide an enable signal to one or more of the plurality of power amplifiers based on an output impedance at the RF output terminal and, based on a value of the supply voltage, to adjust the output impedance matching component to provide a targeted resistance at the plurality of power amplifier output terminals to provide a targeted load line for the plurality of power amplifiers to improve efficiency of the plurality of power amplifiers.

16. The RF module of claim 15 further comprising an envelope tracker implemented on the packaging substrate, the envelope tracker configured to provide an envelope tracking signal based on a received digital envelope signal.

17. The RF module of claim 15 further comprising an LC combiner implemented on the packaging substrate, the LC combiner configured to combine the supply voltage and the envelope tracking signal to power the plurality of power amplifiers.

18. The RF module of claim 15 further comprising a coupler configured to provide a copy of the signal at the RF output terminal to the power amplifier controller.

19. A wireless device comprising:
a transceiver configured to generate a radio-frequency (RF) signal;
a front-end module (FEM) in communication with the transceiver, the FEM including a packaging substrate configured to receive a plurality of components, the FEM further including a power amplification system implemented on the packaging substrate, the power amplification system including a plurality of power amplifiers connected in parallel between a radio-frequency (RF) input terminal and an RF output terminal, each one of the plurality of power amplifiers including a power amplifier input terminal coupled to the RF input terminal, a power amplifier output terminal coupled to the RF output terminal, and an enable terminal for receiving an enable signal, the plurality of power amplifiers powered by a supply voltage, the power amplification system further including an output impedance matching component disposed between the plurality of power amplifier output terminals and the signal output terminal, the power amplification system further including a power amplifier controller configured to selectively provide an enable signal to one or more of the plurality of power amplifiers based on an output impedance at the RF output terminal and, based on a value of the supply voltage, to adjust the output impedance matching component to provide a targeted resistance at the plurality of power amplifier output terminals to provide a targeted load line for the plurality of power amplifiers to improve efficiency of the plurality of power amplifiers; and
an antenna in communication with the FEM, the antenna configured to transmit the amplified RF signal received from the power amplification system.

20. The wireless device of claim 19 further comprising a coupler configured to provide a copy of the signal at the RF output terminal to the power amplifier controller.

* * * * *